United States Patent [19]
Hsu

[11] Patent Number: 5,831,311
[45] Date of Patent: Nov. 3, 1998

[54] ELECTRO-STATIC DISCHARGE PROTECTION DEVICE HAVING A THRESHOLD VOLTAGE ADJUSTMENT AREA

[75] Inventor: Chen-Chung Hsu, Taichung, Taiwan

[73] Assignee: United Microelectronics Corp., Hsinchu, Taiwan

[21] Appl. No.: 764,216

[22] Filed: Dec. 13, 1996

[30] Foreign Application Priority Data

Sep. 23, 1996 [TW] Taiwan ................................ 85111612

[51] Int. Cl.⁶ .................................................. H01L 23/62
[52] U.S. Cl. ......................... 257/355; 257/360; 257/647
[58] Field of Search .................................. 257/647, 409, 257/410, 411, 402, 403, 404, 355–363

[56] References Cited

U.S. PATENT DOCUMENTS

| | | | |
|---|---|---|---|
| 5,158,899 | 10/1992 | Yamagata | 257/355 |
| 5,239,195 | 8/1993 | Compagne | 257/360 |
| 5,349,227 | 9/1994 | Murayama | 257/360 |
| 5,371,395 | 12/1994 | Hawkins | 257/360 |
| 5,406,105 | 4/1995 | Lee | 257/355 |
| 5,463,239 | 10/1995 | Mühlemann | 257/355 |
| 5,502,317 | 3/1996 | Duvvury | 257/360 |
| 5,682,051 | 10/1997 | Harrington, III | 257/403 |

*Primary Examiner*—David B. Hardy
*Attorney, Agent, or Firm*—Rabin & Champagne, P.C.

[57] ABSTRACT

A low voltage electro-static discharge protective device includes a field oxide layer on a substrate, source/drain regions beside the field oxide layer in the substrate, and a threshold voltage adjustment region under the field oxide layer. The fabricating of the protective device includes forming a pad oxide layer and a silicon nitride layer on a substrate, etching the silicon nitride layer to form an opening, forming a oxide spacer on the exposed portion of the pad oxide layer around the periphery of the opening, implanting ions into the substrate, forming a field oxide layer in the opening so that the certain type of ions form a threshold voltage adjustment region under the field oxide layer, removing the silicon nitride layer, removing the exposed pad oxide layer, and forming source/drain regions beside the field oxide layer.

6 Claims, 2 Drawing Sheets

ELECTRO-STATIC DISCHARGE PROTECTION DEVICE HAVING A THRESHOLD VOLTAGE ADJUSTMENT AREA

BACKGROUND OF THE INVENTION

1. Field of the Invention

The invention relates in general to an electrostatic discharge (ESD) protective device for an integrated circuit (IC) and its fabrication, and more particularly to an ESD protective device with a low threshold voltage and a process for its fabrication.

2. Description of the Related Art

In general, ICs are easily damaged by ESD. Tolerance of ESD varies from device to device. However, a metal-oxide semiconductor field effect transistor (MOSFET) is one of the most easily damaged devices. Techniques for fabricating an IC semiconductor are now in the range of deep sub-microns, for example, less than 0.35 $\mu$. Therefore, a common thickness of a deep sub-micron gate oxide is about 75~85Å.

A cross sectional view of a conventional metal gate field threshold device is shown in FIG. 1. A P-type dopant 12 is typically implanted in a substrate 10 under a field oxide layer (FOX) 11 to increase field isolation of the metal gate field threshold device. Subsequently, the field threshold voltage is more than about 12V.

The threshold voltage of the field oxide layer will be much larger than that of a gate oxide layer if the thickness of the gate oxide layer is much smaller than the thickness of the field oxide layer. As the trend of high integration continues, the sizes of devices must be reduced. However, as channel length is reduced, the width of the source/drain's depletion layer can be almost the same as the channel length. Therefore, the phenomenon called "punch through" tends to occur, which causes the mixing up of the two depletion layers, and the gate can barely control current.

The threshold voltage of the metal gate field threshold device is much larger than the breakdown voltage of a gate oxide layer with a thickness of about 75~85 Å, which is about 8V. Therefore, it is now of great interest to find a low voltage ESD protective device, which is suitable for operation at less than about 3.3V but without damaging the gate oxide layer.

SUMMARY OF THE INVENTION

A field threshold device is rapidly turned on by "punch through". Moreover, another advantage of a field threshold device is that it can be located under a bonding pad and therefore does not occupy extra surface area. Consequently, one object of the invention is to provide a field threshold device and its fabricating method which reduces the threshold voltage. Therefore, the field threshold device can be applied to manufacturing a low voltage protective circuit.

According to an object of the invention, a low voltage electrostatic discharge protective device is provided. The protective device includes: a field oxide layer on a substrate, source/drain regions in the substrate beside the field oxide layer, wherein the source/drain regions are doped with a certain type of ions, and a threshold voltage adjustment area in the substrate below the field oxide layer, wherein the threshold voltage adjustment area is doped with the same type of ions as the source/drain regions.

It is therefore another object of the invention to provide a method of fabricating a low voltage electrostatic discharge protective device. This method includes the steps of: forming a pad oxide layer and a silicon nitride layer on a substrate, etching the silicon nitride layer to form an opening which exposes a portion of the pad oxide layer and has a periphery, forming a silicon oxide spacer on the exposed pad oxide layer around the periphery of the opening, implanting a certain type of ions into the substrate using the silicon oxide spacer and the silicon nitride layer as masks, forming a field oxide layer over the substrate and within the silicon oxide spacer, wherein the certain type of ions in the substrate forms a threshold voltage adjustment region under the field oxide layer, removing the silicon nitride layer, removing the exposed pad oxide layer, and forming source/drain regions beside the field oxide layer, wherein the source/drain regions are doped with the same type of ions as the threshold voltage adjustment region.

BRIEF DESCRIPTION OF THE DRAWINGS

Other objects, features, and advantages of the invention will become apparent from the following detailed description of the preferred but non-limiting embodiments, with reference to the accompanying drawings in which.

DESCRIPTION OF THE PREFERRED EMBODIMENT

Figure 1:
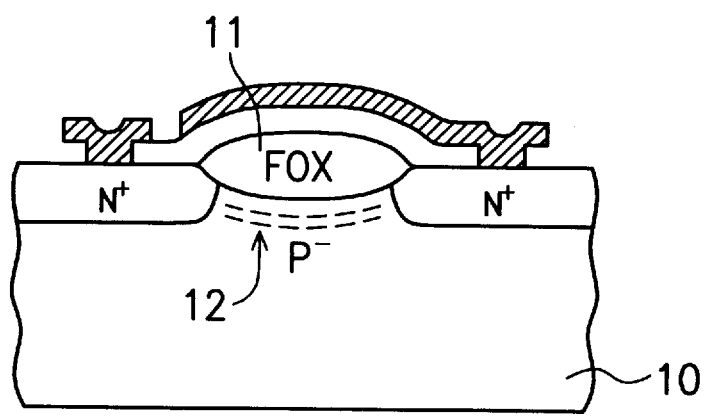
FIG. 1 is a cross-sectional view showing a conventional metal gate field threshold device.
Figure 2A:
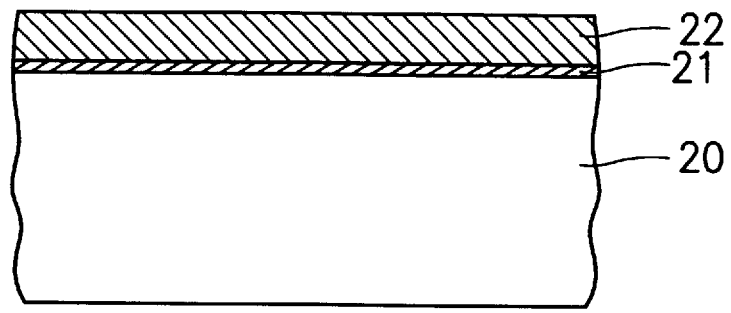
FIGS. 2A through 2C are cross-sectional views showing the steps of fabricating a metal gate field threshold device according to a preferred embodiment of the invention.

Referring to FIG. 2A, a pad oxide layer 21 and a silicon nitride layer 22 are formed in succession on a substrate 20, for example, a P-type substrate. The pad oxide layer 21 may, for example, have a thickness on the order of magnitude of 100 Å and be formed by thermal oxidation. The silicon nitride layer 22 may have a thickness of, for example, 1000~2000 Å and be formed by low pressure chemical vapor deposition (LPCVD).

Figure 2B:
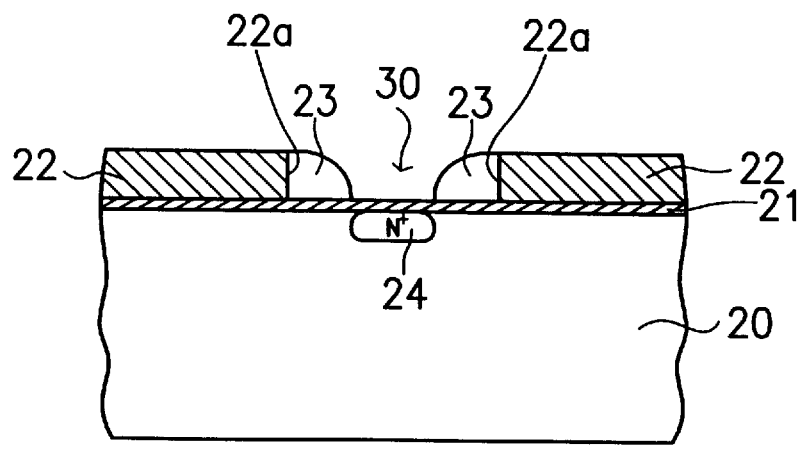

Referring to FIG. 2B, the silicon nitride layer 22 is patterned by a photolithography and etching technique to form an opening 30. A silicon oxide spacer 23 is formed around the periphery 22a of the opening 30. The spacer 23 can be formed, for example, by depositing a silicon oxide layer and etching back. A mask (not shown) is formed over the substrate 20 only exposing the ESD protective circuit. N-type ions, such as arsenic ions, are implanted into the substrate 20 to form a N+ diffusion region 24 within the spacer 23 in the substrate 20. According to requirement, the size of the spacer 23 can be adjusted, which directly controls the size of the diffusion region 24 and therefore controls the device's threshold voltage.

Figure 2C:
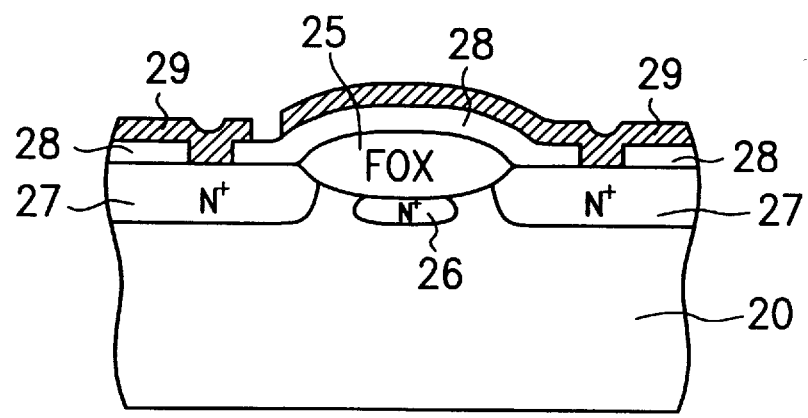

Referring to FIG. 2C, a field oxide layer 25 is formed on the exposed surface of the substrate 20, which is at a bottom end of the opening 30. The field oxide layer can be formed, for example, by wet oxidation. As the field oxide 25 is formed, the ions in the $N^+$ diffusion region 24 are driven simultaneously to form a threshold voltage adjustment region 26. The silicon nitride layer 22 is etched to be removed. Then, the exposed pad oxide layer 21 is etched to be removed. Next, $N^+$ source/drain regions 27 are formed beside the field oxide layer 25 in the substrate 20 so as to be spaced from the adjustment region 26 as shown in FIG. 2C. An insulating layer 28, for planarization, and wiring lines 29 are fabricated by conventional processes.

Although the substrate is P-type, the source/drain regions and the threshold voltage adjustment region are both $N^+$ doped according to the preferred embodiment of the invention. However, the scope of the invention is not limited thereto. It is easily inferred that if the source/drain regions are P$^+$ doped, the threshold voltage adjustment region is P$^+$ doped according to the spirit of the invention.

It would be readily apparent to those skilled in this art that the invention has the following characteristics:

1. For a N-type MOS device, the threshold voltage adjustment region is an N$^+$ diffusion region, which is able to reduce the threshold voltage of the field threshold device effectively and is also suitable for application as a deep sub-micron ESD protective circuit.

2. The size of the threshold voltage adjustment region can be adjusted to meet different demands for different ICs. Therefore, a varied threshold voltage can be obtained.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A low voltage electro-static discharge protective device, comprising:

a substrate;

a field oxide layer on the substrate;

a pair of source/drain regions in the substrate on opposite sides of the field oxide layer, wherein the source/drain regions are doped with a certain type of ions; and a threshold voltage adjustment area in the substrate below the field oxide layer, wherein the threshold voltage adjustment area is doped with the certain type of ions and is selectively located between and spaced from both of the source/drain regions.

2. A device as claimed in claim 1, wherein the certain type of ions comprise N-type ions.

3. A device as claimed in claim 2, wherein the N-type ions comprise arsenic ions.

4. A low voltage electro-static discharge protective device, comprising:

a substrate;

a field oxide layer on the substrate, the field oxide layer having opposite sides;

a pair of source/drain regions in the substrate on the opposite sides of the field oxide layer, wherein the source/drain regions are doped with a certain type of ions; and a threshold voltage adjustment area in the substrate between the source/drain regions, directly below the field oxide layer, and having opposite sides, a width of the threshold voltage adjustment area, measured between the sides of the threshold voltage adjustment area in a given direction, being less than a width of the field oxide layer measured between the sides of the field oxide layer in the given direction, the threshold voltage adjustment area being doped with the certain type of ions and selectively located between and spaced from the sides of the field oxide layer, whereby the threshold voltage adjustment area is selectively located between and spaced from the pair of source/drain regions.

5. A device as claimed in claim 4, wherein the certain type of ions comprises N-type ions.

6. A device as claimed in claim 5, wherein the N-type ions comprise arsenic ions.

* * * * *